United States Patent
Brennan et al.

(10) Patent No.: US 6,816,403 B1
(45) Date of Patent: Nov. 9, 2004

(54) CAPACITIVELY COUPLED SENSING APPARATUS AND METHOD FOR CROSS POINT MAGNETIC RANDOM ACCESS MEMORY DEVICES

(75) Inventors: Ciaran J. Brennan, Essex Junction, VT (US); John K. DeBrosse, Colchester, VT (US); Russell J. Houghton, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/249,876

(22) Filed: May 14, 2003

(51) Int. Cl.$^7$ .............. G11C 11/00; G11C 7/00; G11C 7/02
(52) U.S. Cl. ............ 365/158; 365/205; 365/207
(58) Field of Search ............... 365/158, 171, 365/173, 205, 207, 208

(56) References Cited

U.S. PATENT DOCUMENTS

| | | | | |
|---|---|---|---|---|
| 4,461,965 A | * | 7/1984 | Chin | 365/205 |
| 5,969,998 A | | 10/1999 | Oowaki et al. | 365/189.09 |
| 6,128,239 A | | 10/2000 | Perner et al. | 365/158 |
| 6,185,143 B1 | | 2/2001 | Perner et al. | 365/171 |
| 6,388,917 B2 | * | 5/2002 | Hoffmann et al. | 365/158 |
| 6,396,733 B1 | | 5/2002 | Lu et al. | 365/158 |
| 6,424,564 B2 | * | 7/2002 | Li et al. | 365/158 |
| 6,462,979 B2 | * | 10/2002 | Schlosser et al. | 365/158 |
| 6,512,688 B2 | * | 1/2003 | Thewes et al. | 365/158 |
| 6,512,689 B1 | * | 1/2003 | Naji et al. | 365/158 |
| 6,674,679 B1 | * | 1/2004 | Perner et al. | 365/207 |

FOREIGN PATENT DOCUMENTS

JP 2001358315 A 11/2001

OTHER PUBLICATIONS

A very low offset voltage auto–zero stabilized CMOS operational amplifier Daniel Dzahini, Hamid Ghazlane, Institut des Science Nucleaires, Centre National de L'Energie, des Sciences et des Techniques Nucleaires.

High–Speed Sensing Scheme for CMOS DRAM's Sang H. Dhong, Nicky Chau–Chun Lu, Wei Hwang, and Stephen A. Parke, IEEE Journal of Solid–State Circuits, vo 23 No 1 Feb. 1998.

A Novel Sensing Scheme for a MRAM with a 5% MR Ratio, Kouichi Yamada, Naofumi Sakai, Yoshiyuki Ishizuka and Kazunobu Mameno, Microelectronics Research Center, 2002 symposium on VLSI Circuits Digest of Technical Papers, p. 123–124, SANYO Electric Co., LTD., Ohmori Anpachi–cho, Gifu 503–0195, Japan.

* cited by examiner

Primary Examiner—Trong Phan
(74) Attorney, Agent, or Firm—Margaret A. Pepper; Cantor Colburn LLP

(57) ABSTRACT

A method for sensing data stored within a cross point magnetic random access memory (MRAM) device includes establishing an offset voltage of a sense amplifier, the sense amplifier selectively coupled to a selected bitline within the MRAM device, the selected bitline being in communication with an MRAM cell to be read. A read current is applied through the MRAM cell to be read, and a reference current is applied through the selected bitline. A signal voltage is sensed on the selected bitline, the signal voltage being generated in response to the read current and the reference current. The signal voltage is coupled to an input of the sense amplifier, wherein the sense amplifier provides an offset corrected output reflective of the data state of the MRAM cell.

14 Claims, 3 Drawing Sheets

CAPACITIVELY COUPLED SENSING APPARATUS AND METHOD FOR CROSS POINT MAGNETIC RANDOM ACCESS MEMORY DEVICES

BACKGROUND OF INVENTION

The present invention relates generally to magnetic memory devices and, more particularly, to a capacitively coupled sensing apparatus and method for cross point magnetic random access memory (MRAM) devices.

Magnetic (or magneto-resistive) random access memory (MRAM) is a promising technology in the development of non-volatile random access memory that could begin to replace the existing dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer, and arranged into a magnetic tunnel junction (MTJ). Digital information is stored and represented in the memory element as directions of magnetization vectors in the magnetic layers. More specifically, magnetic vectors in one magnetic layer (also referred to as a reference layer) are magnetically fixed or pinned, while the magnetization direction of the other magnetic layer (also referred to as a "free" layer) may be switched between the same direction and the opposite direction with respect the fixed magnetization direction of the reference layer. The magnetization directions of the free layer are also known "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistances in response to a vertically applied current with respect to the TMR device. The particular resistance of the TMR device thus reflects the magnetization state of the free layer, wherein resistance is "low" when the magnetization is parallel, and "high" when the magnetization is antiparallel. Accordingly, a detection of changes in resistance allows an MRAM device to provide information stored in the magnetic memory element (i.e., a read operation). In addition, an MRAM cell is written to through the application of a bi-directional current in a particular direction, in order to magnetically align the free layer in a parallel or antiparallel state.

However, one difficulty with the practical operation of a cross-point MRAM array relates to the sensing of a particular cell, given that each cell in the array is coupled to the other cells through several parallel leakage paths. The resistance seen at one cross point equals the resistance of the memory cell at that cross point in parallel with resistances of memory cells in the other rows and columns. If the memory cell being sensed has a different resistance due to the stored magnetization, a small differential voltage may develop. This small differential voltage in turn can give rise to a parasitic current, which is typically much larger than the sense current, and thus can obscure the sensing of the sense current and hence the resistance of the cell. As a result, complex auto-zeroing techniques have been implemented in conventional sensing schemes to subtract out the error voltage or the error current. Moreover, because the selected bit line voltage is controlled by a feedback amplifier, the stable operation thereof requires a compensation capacitance, which results in a slower read access time.

SUMMARY OF INVENTION

The foregoing discussed drawbacks and deficiencies of the prior art are overcome or alleviated by a sensing apparatus for a cross point magnetic random access memory (MRAM) device. In an exemplary embodiment, a sense amplifier is selectively coupled to a selected bitline, the selected bitline being in communication with a selected MRAM cell to be read, and the selected MRAM cell further in communication with a selected wordline associated therewith. A reference current source is coupled to the selected bitline. The sense amplifier is configured to receive as an input thereto a signal voltage generated on said selected bitline, the signal voltage being generated in response to a reference current supplied by the reference current source and a read current applied through the selected MRAM cell. The sense amplifier is further configured to provide an offset corrected, amplified output reflective of the data state of the selected MRAM cell.

In another aspect, a method for sensing data stored within a cross point magnetic random access memory (MRAM) device includes establishing an offset voltage of a sense amplifier, the sense amplifier selectively coupled to a selected bitline within the MRAM device, the selected bitline being in communication with an MRAM cell to be read. A read current is applied through the MRAM cell to be read, and a reference current is applied through the selected bitline. A signal voltage is sensed on the selected bitline, the signal voltage being generated in response to the read current and the reference current. The signal voltage is coupled to an input of the sense amplifier, wherein the sense amplifier provides an offset corrected output reflective of the data state of the MRAM cell.

In still another aspect, a method for sensing data stored within a cross point magnetic random access memory (MRAM) device includes coupling a sense amplifier to a selected bitline, the selected bitline being associated with a plurality of MRAM cells defined at intersections of the selected bitline and a plurality of wordlines. A shorting device within said sense amplifier is activated and deactivated so as to store a DC offset value associated with the sense amplifier. The plurality of wordlines and at least one reference wordline are initially biased at an equalization voltage, and the voltage on a selected one of the plurality of wordlines is altered from the equalization voltage, thereby causing a read current to flow through a selected MRAM cell. The voltage on the at least one reference wordline is also altered from the equalization voltage, thereby causing a reference current to flow through the selected bitline. A signal voltage developed on the bitline is amplified, the signal voltage having a polarity reflective of the data state of selected MRAM cell, wherein the amplified signal voltage is offset corrected by the sense amplifier.

BRIEF DESCRIPTION OF DRAWINGS

Referring to the exemplary drawings wherein like elements are numbered alike in the several Figures.

DETAILED DESCRIPTION

Figure 1:
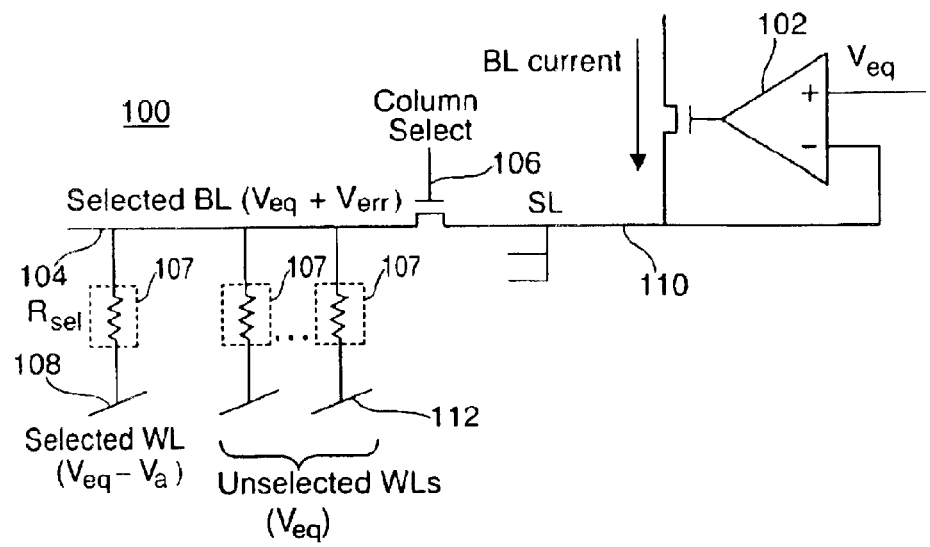
FIG. 1 is a schematic diagram of a conventional sensing scheme for a cross-point MRAM device.

Referring initially to FIG. 1, there is shown a schematic diagram of a conventional sensing scheme 100 for a cross-point MRAM device. A differential sense amplifier 102 is selectively coupled to a selected bitline (BL) 104 through a column select device 106 (e.g., a field effect transistor (FET)), for the purpose of sensing or reading data stored in an MRAM cell 107 at the junction of the selected bitline 104 and a selected wordline (WL) 108. The column select device 106, when activated, couples the selected bitline 104 to a sense line (SL) 110, which in turn is coupled to the differential sense amplifier 102. In addition, the sense line 110 may be fanned out to a number of bitlines, such that a multiplexing scheme is used to connect any of the bitlines to the sense line 110.

In operation, the sensing scheme 100 of FIG. 1 determines a resulting bitline current through the MRAM cell when a voltage differential is applied between the selected bitline 104 and the selected wordline 108. As is known in the art, the resistance of the MTJ of an MRAM cell (represented by $R_{sel}$ in FIG. 1) varies in accordance with the value of the data stored therein. Thus, by measuring the value of the resulting bitline current in response to a voltage thereacross, the value of the cell data is determined. More specifically, the unselected wordlines 112 are held at an equalization voltage ($V_{eq}$), while the voltage of the selected wordline 108 is lowered by an applied voltage ($V_a$) to a value of about $V_{eq}-V_a$. The differential amplifier 102, being configured in a negative feedback fashion, attempts to hold the voltage on the selected bitline 104 at $V_{eq}$. Ideally, the only current then flowing through the selected bitline 104 would be the current $I_{sel}$ passing through the selected cell (given by $V_a/R_{sel}$), since both the unselected wordlines 112 and the selected bitline 104 would be at $V_{eq}$. Thus, the unselected cells along the bitline 104 would have no differential voltage applied thereacross.

In reality, however, there is always at least some small offset error in the voltage applied to the selected bitline 104 ($V_{eq}+V_{err}$). This offset error voltage, for the most part, is due to device threshold mismatch within the differential amplifier 102 controlling the selected bitline voltage. As a result, the error voltage will create an error current $I_{err}$ passing through the unselected cells along the selected bitline 104. Unfortunately, in order for this error current to be small relative to the signal current (so as to be able to conveniently detect the correct selected cell current), the error voltage must be well below the device threshold mismatch tolerances associated with a CMOS process (which are typically on the order of about 5 to 10 millivolts).

Therefore, in accordance with an embodiment of the invention, there is disclosed a capacitively coupled sensing apparatus and method for cross point magnetic MRAM devices. Briefly stated, a reference current is applied to the selected bitline and a read current is applied to the data cell to be read, thereby generating a signal voltage on the selected bitline in response to the reference current, the current representative of the data state and the offset current. The selected bitline is further coupled to a sense line in signal communication with a capacitively coupled inverting amplifier that effectively compensates for any offset resulting from individual device threshold mismatching.

Figure 2:
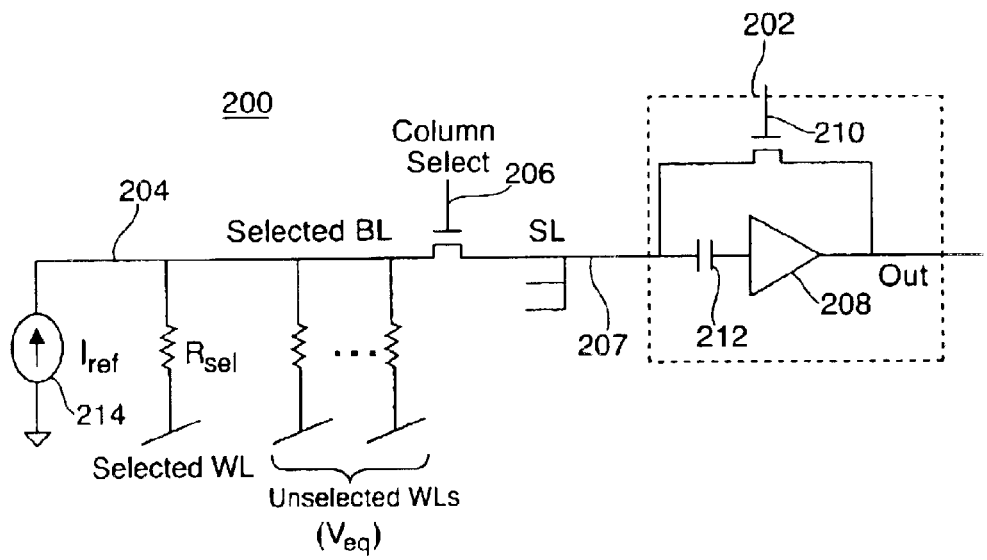
FIG. 2 is a schematic diagram of a capacitively coupled sensing apparatus for a cross-point MRAM device, in accordance with an embodiment of the invention.

Referring now to FIG. 2, there is shown a schematic diagram of a novel sensing apparatus 200, in which a sense amplifier 202 is selectively coupled to a selected bitline 204 through column select device 206 and sense line 207. As is described in greater detail hereinafter, the sense amplifier 202 is a capacitively coupled, inverting voltage amplifier 208 that utilizes a shorting device 210 (e.g., an FET) to establish the DC operating point thereof. The DC offset is stored on capacitor 212. In addition, a reference current source 214 is used to provide a reference current onto the selected bitline 204. By designing the reference current source to provide a reference current on the selected bitline 204 at a value between the two current levels of opposite data states, the resulting net current through the selected bitline 204 will have a polarity reflective of either a "0" data bit or a "1" data bit stored within the selected cell.

Figure 3:
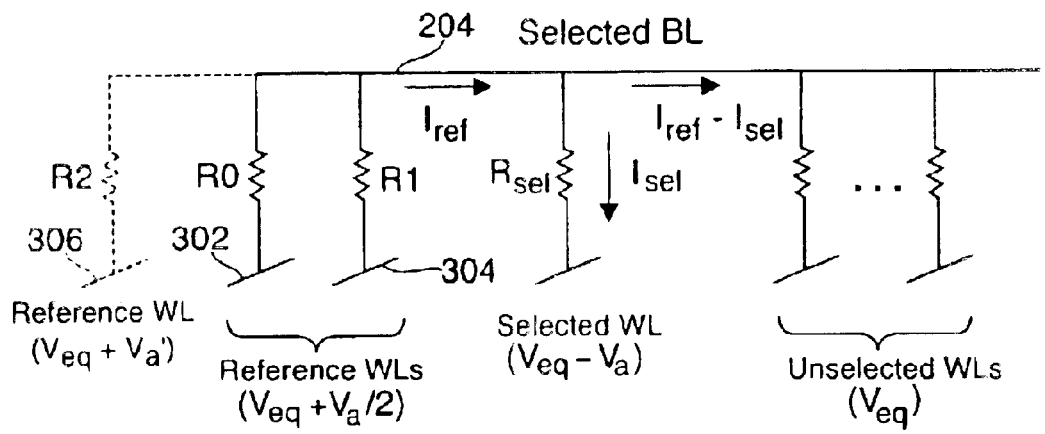
FIG. 3 is a schematic diagram of one possible embodiment of the reference current source shown in FIG. 2.

In order to generate the reference current ($I_{ref}$) a pair of reference wordlines are configured, wherein a first of the reference wordlines 302 includes reference cells that are all preconditioned to a "0" data state, while a second of the reference wordlines 304 includes reference cells that are all preconditioned to a "1" data state, as illustrated in FIG. 3. In other words, the reference cells in the first reference wordline 302 will have a collective first resistance R0, while the reference cells in the second reference wordline 304 will have a collective second resistance R1 such that the average of two currents flowing therethrough is sent through the selected bitline 204.

Figure 4:
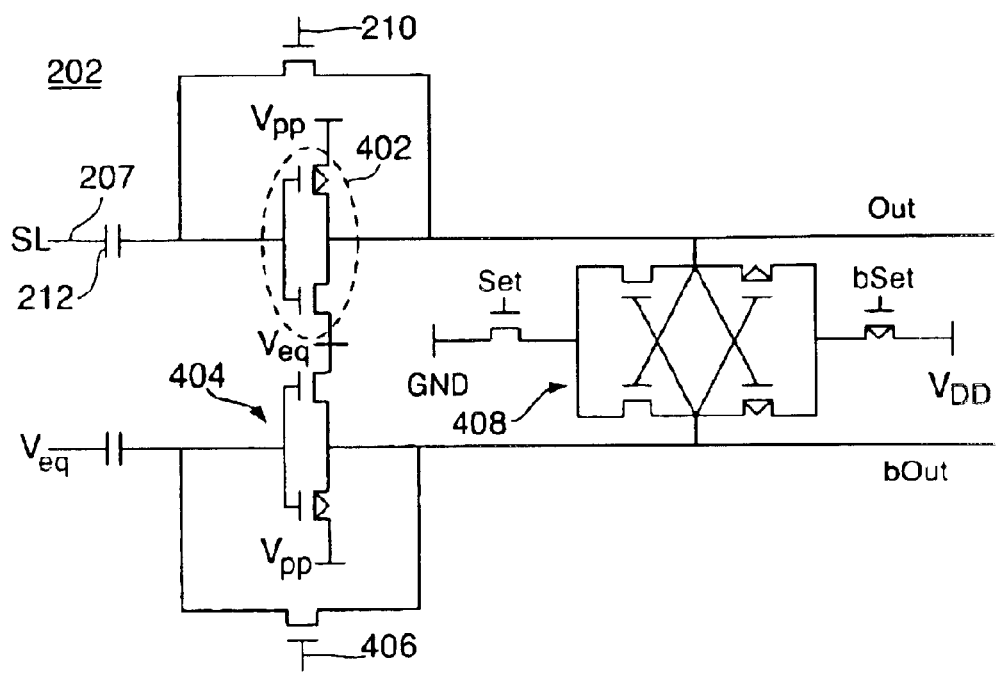
FIG. 4 is a schematic diagram of one possible embodiment of the sense amplifier shown in FIG. 2.

FIG. 4 is a schematic diagram of one possible embodiment of the sense amplifier 202 shown in FIG. 2. A CMOS inverter 402 is used as an inverting amplifier (i.e., an NFET and PFET in a common source configuration), which is capacitively coupled to the sense line 207 through capacitor 212, as stated previously. In addition, another CMOS inverter 404 is used to provide an amplified inverted reference voltage signal, being capacitively coupled to $V_{eq}$. The source voltages of the NFETs of both inverters 402, 404 are tied to $V_{eq}$ in order to improve immunity, while the source voltage of the PFETs ($V_{pp}$) is selected to maximize the voltage gain of the amplifier. As is the case with the shorting device 210, the reference inverting amplifier 404 also includes a shorting device 406 across the input and output thereof.

The output of the inverting voltage amplifier 402 drives one side (Out) of a CMOS cross-coupled latch 408, while the other side thereof (bOut) is driven by the reference inverting amplifier. Initially, the supply nodes (GND, $V_{DD}$) of the latch 408 are allowed to float. Then, after a sufficient signal is allowed to develop across the latch 408, access NFET (Set) and PFET (bSet) are activated to couple the latch supply nodes to the power source thereof (GND and $V_{DD}$, respectively), to further amplify the sense line signal to a full CMOS level. It will be appreciated that since the signal at the output of the inverting amplifiers 402, 404 has been amplified, any effects due to device threshold mismatch between the inverting voltage amplifiers 402, 404 (or between the cross-coupled inverters of the latch 408) will be substantially eliminated.

Figure 5:
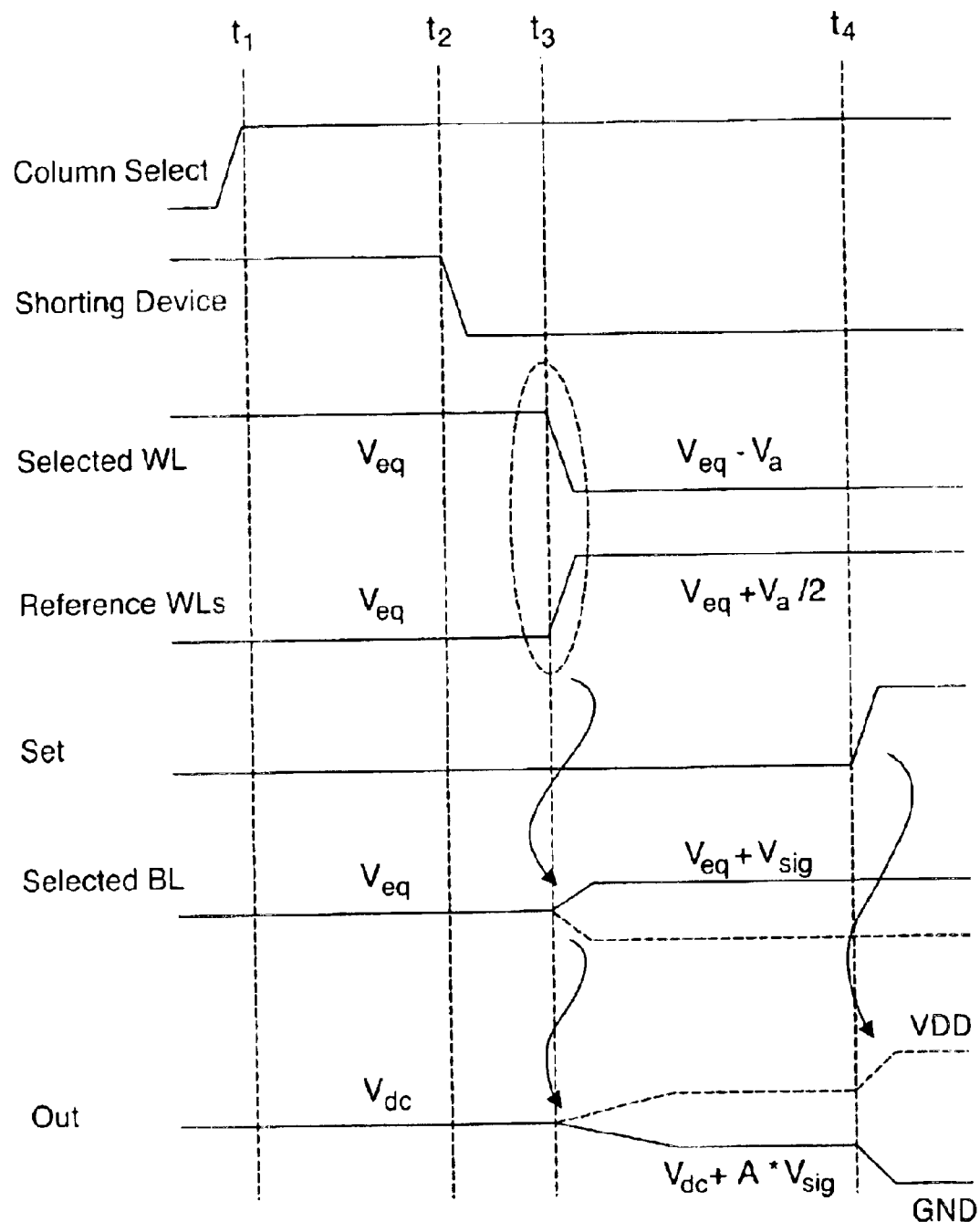
FIG. 5 is a timing diagram illustrating an embodiment of a method for sensing data in a cross point MRAM device, in accordance with the sensing scheme illustrated in FIGS. 2 through 4.

FIG. 5 is a timing diagram illustrating an embodiment of a method for sensing data in a cross point MRAM device, in accordance with the sensing scheme illustrated in FIGS. 2 through 4. A read cycle is commenced with the coupling of the selected bitline 204 to the sense line 207, when the column select device 206 is energized (the unselected bitlines may be allowed to float). This is reflected at time $t_1$ in FIG. 5, wherein the "column select" signal goes from low to high. Prior thereto, the "shorting device" signal remains at a high level, signifying the shorting of the sense amplifier 202 output and input. In addition, the selected wordline and reference wordlines are initially biased at the equalization voltage, $V_{eq}$. The unselected wordlines and the selected bitlines settle to a voltage equal to $V_{eq}$. At time $t_2$, and after the amplifier DC offset has been stored on capacitor 212, the shorting device 210 is deenergized. Since the coupling capacitor 212 of the sense amplifier 202 has stored the DC offset, the next phase of the reading operation may be implemented.

At time $t_3$, the selected WL is driven to $V_{eq}$ minus the applied voltage ($V_a$) or $V_{eq}-V_a$. Concurrently, the reference current is applied to the bitline by driving the voltage on each of the reference lines from $V_{eq}$ to $V_{eq}+V_a/2$. As a result of both the applied reference current and the data-dependent current through the selected MRAM cell ($I_{sel}$), a net current is produced through the selected bitline, the polarity of which depends on the state of the data in the cell, since this determines the value of $R_{sel}$. Depending upon the polarity of the net current (denoted by $I_{ref}-I_{sel}$ in FIG. 3), the selected bitline and sense line settle to a voltage slightly above or below $V_{eq}$ by an amount designated by $V_{sig}$. As shown in FIG. 5, the value of the voltage on the selected bitline increases to $V_{eq}+V_{sig}$ in one data state or (as indicated by the dashed line) decreases to $V_{eq} V_{sig}$. The specific value of $V_{sig}$ is accurately approximated by $(I_{ref}-I_{sel})*R_{unsel}$, where $R_{unsel}$ is the combined parallel resistance of the unselected cells along the selected bitline.

In response to the change in voltage of the selected bitline, the corresponding output of the inverting voltage amplifier responds by falling or rising from the DC offset voltage ($V_{dc}$) by a voltage equal to $V_{sig}$ multiplied the voltage gain (A) of the inverting voltage amplifier. Accordingly, the solid line in the "out" signal in FIG. 5 decreases by an amount given by the expression $V_{dc}+A*V_{sig}$ (with the gain "A" being a negative number for an inverting amplifier). Conversely, the dashed line in the "out" signal indicates an increase if the voltage on the selected bitline is increased. Finally, at time $t_4$, the "set" signal in FIG. 5 is increased from low to high, thereby coupling the supply nodes of CMOS latch 408 to their respective rail voltages, which results in the signal on the sense amplifier output to be increased to either $V_{DD}$ or decreased to GND.

As will be appreciated, both the above described sensing scheme and method may be implemented through several other possible embodiments. For example, the column select device 206 could be replaced by a direct coupling of each bitline to a separate sense line and sense amplifier. Although this would entail additional device area, the need for multiplexing a column select signal for several bitlines sharing a common sense amplifier is eliminated. In another possible embodiment of the sense amplifier 202, the outputs of the inverting voltage amplifiers 402, 404 could drive the inputs of a differential amplifier, as opposed to the CMOS cross-coupled latch 408 of FIG. 4.

Alternative embodiments are also contemplated with regard to the reference current source 214. For example, in lieu of a pair of reference wordlines (302, 304) having reference cells set to opposite data states, a single reference wordline 306 and having a collective resistance R2 (shown in phantom in FIG. 3), with each cell thereon conditioned to a known state could also be used. In order to generate the same magnitude of reference current ($I_{ref}$) as shown in FIG. 3, the single reference wordline 306 is driven to a voltage $V_{eq}+V_a'$, wherein $V_a'$ is selected such that the current through the reference cell 306 is equal to the average of the currents flowing through two selected cells of opposite data states. Furthermore, the location of the reference current source need not be dependent on the location of the selected bitline. In other words, the reference current could be directly forced into or out of the sense line instead of the selected bitline. Moreover, the reference current source 214 need not be created through a reference wordline(s)/cell(s); a conventional current source may also be implemented.

In the exemplary embodiment of FIGS. 2–4, the sense line 207 settles to $V_{eq}$ before the shorting device 210 is turned off. Equivalently, the sense line 207 could be held at $V_{eq}$ by a separate precharge device, with the activation of the column select device 210 being delayed until after the shorting device 210 is turned off.

This effectively multiplexes the sense amplifier input from $V_{eq}$ to the selected bitline 204. Both the selected wordline and the reference current could be activated throughout the entire read cycle in such a case. Alternatively, a multiplexer circuit could be disposed between the sense lines and the sense amplifier in order to switch the sense amplifier input from $V_{eq}$ to $V_{eq}+V_{sig}$ after the shorting device is deactivated. This would also allow the selected wordline and the reference current to be activated throughout the entire read cycle.

As is the case with the particular sensing apparatus embodiments outlined above, variations within the sensing read/cycle are also contemplated. For example, rather than allowing the unselected bitlines to float, they could also be driven to $V_{eq}$. Also, the polarity of the applied voltages to the selected and reference wordlines could be reversed such that the selected wordline voltage is driven to $V_{eq}+V_a$, while the reference wordline are driven to $V_{eq}-V_a/2$. Stated another way, the applied voltage $V_a$ may be either positive or negative, so long as this value is added/subtracted with respect to the selected wordline and subtracted/added with respect to the reference wordlines.

In the exemplary embodiment described in FIG. 5, both the reference current ($I_{ref}$) and the selected wordline current ($I_{sel}$) are sensed simultaneously by applying the corresponding voltages to the reference wordlines and selected wordline once the shorting device is deactivated. However, this sequence could be reversed by activating the selected wordline and reference wordline voltages prior to deactivating the shorting device, and then restoring the applied voltages to the selected wordline and reference wordlines to $V_{eq}$ after the shorting device is turned off. Alternatively, a sequential sensing technique could be implemented wherein either $I_{ref}$ or $I_{sel}$ is sensed prior to deactivating the shorting device of the sense amplifier.

Regardless of the particular embodiment(s) implemented, present MRAM sensing scheme and method provides several advantages over a conventional sensing scheme, in that the sensed signal $V_{sig}$ is independent of the base value of the MTJ resistance, which in turn is strongly dependent upon several process variables. Moreover, this sensing is accomplished while also substantially eliminating sensitivity to device threshold. Furthermore, since the amplifier is a single pole amplifier, there are essentially no stability concerns associated therewith, resulting in a potentially faster read access time.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A sensing apparatus for a cross point magnetic random access memory (MRAM) device, comprising:
    a sense amplifier selectively coupled to a selected bitline, said selected bitline in communication with a selected MRAM cell to be read;
    said selected MRAM cell further in communication with a selected wordline associated therewith;
    a reference current source coupled to said selected bitline, said reference current source further comprising
    a first reference wordline, said first reference wordline associated with at least one reference memory cell preconditioned to a first data state; and
    a second reference wordline, said second reference wordline associated with at least one reference memory cell preconditioned to a second data state opposite said first data state; and
    wherein said sense amplifier is further configured to receive as an input thereto a signal voltage generated on said selected bitline, said signal voltage generated in response to a reference current supplied by said reference current source and a read current applied through said selected MRAM cell; and
    said sense amplifier is further configured to provide an offset corrected, amplified output reflective of the data state of said selected MRAM cell.

2. The sensing apparatus of claim 1, wherein said reference current source is configured such that said reference current supplied therefrom has a value between the value of a read current through a cell at said first data state and the value of a read current through a cell at said second data state.

3. A sensing apparatus for a cross point magnetic random access memory (MRAM device, comprising:
    a sense amplifier selectively coupled to a selected bitline, said selected bitline in communication with a selected MRAM cell to be read, said sense amplifier further comprising:
        an inverting amplifier having an input capacitively coupled to a sense line, said sense line selectively coupled to said bitline;
        a storage latch coupled to an output of said inverting amplifier; and
        a shorting device across said input and output of said inverting amplifier, said shorting device configured to enable offset cancellation of said inverting amplifier;
        a reference inverting amplifier having an input capacitively coupled to an equalization voltage and an output coupled to said storage latch, said reference inverting amplifier also including a shorting device across the input and output thereof;
    said selected MRAM cell further in communication with a selected wordline associated therewith; and
    a reference current source coupled to said selected bitline;
    wherein said sense amplifier is further configured to receive as an input thereto a signal voltage generated on said selected bitline, said signal voltage generated in response to a reference current supplied by said reference current source and a read current applied through said selected MRAM cell; and
    said sense amplifier is further configured to provide an offset corrected, amplified output reflective of the data state of said selected MRAM cell.

4. The sensing apparatus of claim 3, wherein said storage latch further comprises a cross coupled CMOS latch having supply nodes selectively coupled to a power source.

5. A method for sensing data stored within a cross point magnetic random access memory (MRAM) device, the method comprising:
    establishing an offset voltage of a sense amplifier, said sense amplifier selectively coupled to a selected bitline within the MRAM device, said selected bitline in communication with an MRAM cell to be read, said sense amplifier further comprising:
        an inverting amplifier having an input capacitively coupled to a sense line, said sense line selectively coupled to said bitline;
        a storage latch coupled to an output of said inverting amplifier;
        a first shorting device across said input and output of said inverting amplifier, said first shorting device configured to enable offset cancellation of said inverting amplifier;
        a reference inverting amplifier having an input capacitively coupled to an equalization voltage and an output coupled to said storage latch, said reference inverting amplifier including a second shorting device across the input and output thereof;
    applying a read current through said MRAM cell to be read;
    applying a reference current through said selected bitline;
    sensing a signal voltage on said selected bitline, said signal voltage generated in response to said read current and said reference current; and
    coupling said signal voltage to an input of said sense amplifier;
    wherein said sense amplifier provides an offset corrected, amplified output reflective of the data state of said MRAM cell.

6. The method of claim 5, wherein said reference current is selected at a value between a first current reflective of a first data state and a second current reflective of a second data state.

7. The method of claim 6, wherein:
    said read current is applied by biasing unselected wordlines of unselected MRAM cells associated with said selected bitline to an equalization voltage, and by altering the voltage on a selected wordline from said equalization voltage, said selected wordline being associated with said MRAM cell to be read.

8. The method of claim 7, wherein said reference current is applied by altering the voltage on at least one reference wordline from said equalization voltage, said at least one reference wordline.

9. The method of claim 7, wherein said sensed signal voltage has a polarity dependent upon the data state of said MRAM cell.

10. The method of claim 5, wherein said establishing an offset voltage further comprises activating said first shorting device, thereby causing a DC offset voltage to be stored on a capacitor coupling said inverting amplifier to said selected bitline.

11. The method of claim 5, wherein said read current and said reference current are applied simultaneously.

12. The method of claim 5, wherein said read current and said reference current are applied sequentially.

13. A method for sensing data stored within a cross point magnetic random access memory (MRAM) device, the method comprising:

coupling a sense amplifier to a selected bitline, said selected bitline associated with a plurality of MRAM cells defined at intersections of said selected bitline and a plurality of wordlines;

said sense amplifier further comprising:

an inverting amplifier having an input capacitively coupled to a sense line, said sense line selectively coupled to said bitline;

a storage latch coupled to an output of said inverting amplifier;

a first shorting device across said input and output of said inverting amplifier, said first shorting device configured to enable offset cancellation of said inverting amplifier;

a reference inverting amplifier having an input capacitively coupled to an equalization voltage and an output coupled to said storage latch, said reference inverting amplifier including a second shorting device across the input and output thereof;

activating and deactivating said first shorting device within said sense amplifier so as to store a DC offset value associated with said sense amplifier;

initially biasing said plurality of wordlines and at least one reference wordline at an equalization voltage;

altering the voltage on a selected one of said plurality of wordlines from said equalization voltage, thereby causing a read current to flow through a selected MRAM cell;

altering the voltage on said at least one reference wordline from said equalization voltage, thereby causing a reference current to flow through said selected bitline; and amplifying a signal voltage developed on said bitline, said signal voltage having a polarity reflective of the data state of selected MRAM cell;

wherein said amplified signal voltage is offset corrected by said sense amplifier.

14. The method of claim 13, further comprising:

coupling said amplified signal voltage to a CMOS storage latch, said storage latch selectively coupled to a power supply such said amplified signal voltage is driven to a high voltage value or a low voltage value corresponding to said power supply.

* * * * *